United States Patent
Osenbach

(10) Patent No.: US 8,653,375 B2
(45) Date of Patent: Feb. 18, 2014

(54) MITIGATION OF WHISKERS IN SN-FILMS

(75) Inventor: John W. Osenbach, Kutztown, PA (US)

(73) Assignee: Agere Systems, Inc., Allentown, PA (US)

( * ) Notice: Subject to any disclaimer, the term of this patent is extended or adjusted under 35 U.S.C. 154(b) by 433 days.

(21) Appl. No.: 13/059,502

(22) PCT Filed: Aug. 21, 2008

(86) PCT No.: PCT/US2008/073850
§ 371 (c)(1),
(2), (4) Date: Feb. 17, 2011

(87) PCT Pub. No.: WO2010/021624
PCT Pub. Date: Feb. 25, 2010

(65) Prior Publication Data
US 2011/0155418 A1    Jun. 30, 2011

(51) Int. Cl.
*H01B 5/00* (2006.01)
(52) U.S. Cl.
USPC .................................................. 174/126.2
(58) Field of Classification Search
USPC ........ 174/36, 110 R, 110 SC, 120 R, 120 SC, 174/260–261, 520, 528–529, 536, 126.2; 420/557, 561–562; 29/843; 257/750, 257/772
See application file for complete search history.

(56) References Cited

U.S. PATENT DOCUMENTS

| | | | |
|---|---|---|---|
| 3,386,161 A | 6/1968 | Ruf | |
| 3,763,403 A * | 10/1973 | Lootens | 257/705 |
| 4,752,118 A | 6/1988 | Johnson | |
| 4,806,704 A * | 2/1989 | Belke et al. | 174/542 |
| 5,435,857 A | 7/1995 | Han et al. | |
| 6,195,248 B1 * | 2/2001 | Kunishi et al. | 361/305 |
| 6,228,322 B1 | 5/2001 | Takeda et al. | |
| 6,361,742 B2 | 3/2002 | Takeda et al. | |
| 6,949,312 B1 | 9/2005 | Kawakami et al. | |
| 2004/0262779 A1 * | 12/2004 | Amagai et al. | 257/779 |
| 2005/0039943 A1 * | 2/2005 | Endo et al. | 174/94 R |
| 2005/0211461 A1 * | 9/2005 | Horikoshi et al. | 174/117 FF |
| 2006/0113683 A1 * | 6/2006 | Dean et al. | 257/783 |
| 2007/0048172 A1 | 3/2007 | Huang et al. | |
| 2007/0092396 A1 | 4/2007 | Huang et al. | |
| 2007/0275262 A1 | 11/2007 | Lin et al. | |
| 2007/0295528 A1 * | 12/2007 | Nishi et al. | 174/126.4 |
| 2008/0246164 A1 * | 10/2008 | Ueshima | 257/782 |

FOREIGN PATENT DOCUMENTS

| | | | |
|---|---|---|---|
| JP | 56123394 A | 9/1981 | |
| JP | 59035694 A | 2/1984 | |
| JP | H07-266080 A | 10/1995 | |
| JP | 2003-023123 A | 1/2003 | |

(Continued)

OTHER PUBLICATIONS

Endicott, Duane W., "The Challenge of Lead-Free Finish for Semiconductor Pins", Metal Finishing, vol. 95, No. 1, Jan. 1, 1997 (XP004056383) ISSN: 0026-0576, pp. 50-54.

(Continued)

*Primary Examiner* — William H Mayo, III
(74) *Attorney, Agent, or Firm* — Hitt Gaines, PC

(57) ABSTRACT

An electronic device includes a metallic conducting lead having a surface. A pre-solder coating over the surface consists essentially of tin and one or more dopants selected from Al or a rare earth element.

27 Claims, 5 Drawing Sheets

(56) References Cited

FOREIGN PATENT DOCUMENTS

| JP | 2007-294735 A | 8/2007 |
|----|---------------|--------|
| WO | 2008075723 A1 | 6/2008 |
| WO | 2010021624 A1 | 2/2010 |

OTHER PUBLICATIONS

Wu, C.M.L., et al., "Properties of lead-free solder alloys with rare earth element additions", Materials Science and Engineering R, vol. 44, No. 1, Apr. 1, 2004, (XP004498264), ISSN: 0927-796X; pp. 44.

Osenbach, J.W., et al., "Sn-Whiskers: Truths and Myths", Journal of Materials Science: Materials in Electronics, vol. 18, No. 1-3, Sep. 23, 2006, (XP019451026), ISSN: 1573-482X, pp. 283-305.

Osenbach, John W., et al., Sn-Whiskers: Truths and Myths, J. Materials Science: Materials in Electronics, 2007, 45 Pages.

Chuang, Tung-Han, et al., Abnormal Tin Whisker Growth in Rare Earth Element-Doped Sn3Ag0.5CuXCe Solder Joints, Materials Science Forum, vols. 539-543 (2007), pp. 4019-4024.

Jiang B., et al., "Spontaneous growth of tin whiskers on tin-rare-earth alloys", Philosophical Magazine Letters, vol. 87, No. 9, Sep. 2007, pp. 657-662.

\* cited by examiner

MITIGATION OF WHISKERS IN SN-FILMS

CROSS-REFERENCE TO RELATED APPLICATION

This application is the National Stage of, and therefore claims the benefit of, International Application No. PCT/US2008/073850 filed on Aug. 21, 2008, entitled "MITIGATION OF WHISKERS IN SN-FILMS," which was published in English under International Publication Number WO 2010/021624 on Feb. 25, 2010. The above application is commonly assigned with this National Stage application and is incorporated herein by reference in its entirety.

TECHNICAL FIELD

This disclosure relates generally to electronics packages, that include Sn (tin) films, and more particularly, to suppression of whisker formation in Sn films.

BACKGROUND

The formation of "whiskers" in Sn (tin) films is a subject of great research interest. Many electronic devices have an anticipated operational lifetime of ten years or more. Yet whiskers may form in a period of months or less. Some whiskers have been observed to reach lengths of several millimeters. Whiskers such as these present a significant reliability risk in electronic systems due to the possibility of forming an undesired conductive path (a short) or causing mechanical damage to particle sensitive devices such as disk drives.

It has long been known that alloying Sn with lead (Pb) reduces the formation of Sn whiskers. However, environmental concerns over the adverse ecological effects of Pb have resulted in legislation in various parts of the world which explicitly restricts the use of Pb in electronics. For example, the Restriction of Hazardous Substances (RoHS) directive, adopted by the European Union in 2003 and effective beginning in 2006, restricts the concentration of lead in any homogeneous component to 0.1% (1000 ppm) or less. The permitted concentration of Pb is, in general, too low to suppress formation of Sn whiskers in all cases in which such whiskers present an unacceptable reliability risk.

Formation of Sn whiskers remains poorly understood. Current theories offer insufficient guidance to provide acceptable alternatives to Pb-doping that are environmentally benign and low-cost.

SUMMARY

To address the above-discussed deficiencies of the prior art, one embodiment of an electronic device is presented. The electronic device includes a metallic conducting lead having a surface. A pre-solder coating is over the surface and consists essentially of tin and one or more dopants selected from Al or a rare earth element.

Another embodiment is a method of forming a pre-solder coating over an electrical lead. The method includes providing a metallic conducting lead having a surface. A tin layer is formed over the surface. The tin layer includes grains separated by grain boundary regions. The tin layer is doped with an average concentration of one or more dopants selected from Al or a rare earth element such that the one or more dopants have a concentration substantially greater in the grain boundary regions than the average.

The foregoing has outlined features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention.

BRIEF DESCRIPTION OF THE DRAWINGS

For a more complete understanding of the present invention, reference is now made to the following descriptions taken in conjunction with the accompanying drawings, in which.

DETAILED DESCRIPTION

The recent efforts to reduce the concentration of lead in tin films have focused almost exclusively on improving the purity of the tin films. For example, electroplating processes have been refined to reduce the concentration of organic compounds that may lead to inclusions that can pin lattice diffusion mechanisms. As discussed further below, it is thought that such pinning may make relaxation-driven diffusion mechanisms energetically favorable that result in whisker growth.

It is presently recognized that whisker growth may be understood to be a form of creep driven by stress relaxation in tin films and enabled by long range grain boundary diffusion in systems that are susceptible to grain boundary pinning. This recognition makes it possible to identify individual dopants and a class of dopants that are expected to significantly reduce the propensity of tin films to develop whiskers. The addition of such dopants is thought to reduce grain boundary pinning, thereby enabling diffusion paths that result in stress relaxation by diffusion pathways that do not contribute to whisker formation. Embodiments presented herein using such dopants run counter to the prevailing wisdom of increasing the purity of tin films to reduce diffusion pinning mechanisms such as, e.g., second phase pinning.

Figure 1:
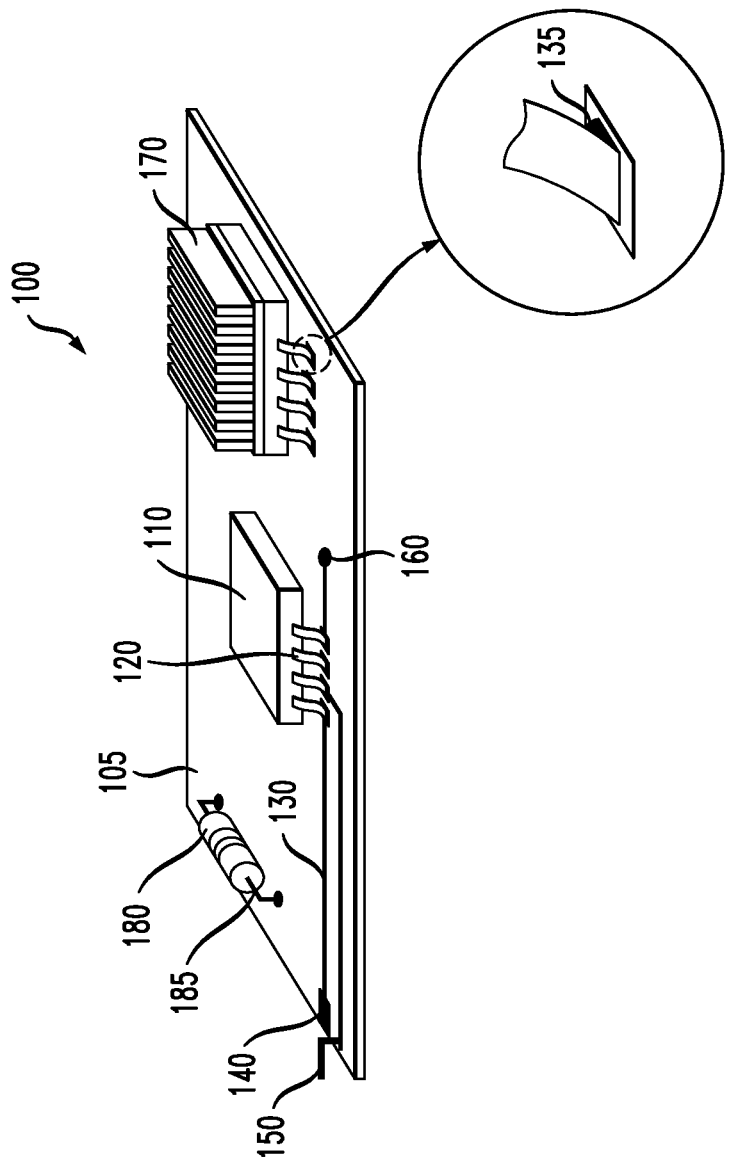
FIG. 1 illustrates various example electronic devices formed according to the invention.

Referring initially to FIG. 1, illustrated is a perspective view of a portion of an example electronic device 100 of the disclosure. The electronic device 100 includes a substrate 105 on which components are formed or attached that may have a tin layer formed thereon. The substrate 105 has a device package 110 mounted thereon. In certain embodiments, the device package 110 is formed from a lead frame. A lead frame is a metallic structure that may include a chip-mounting region, support structures, and leads that are later cut from the support structures and bent to form package leads. The lead frame may be used to facilitate the packaging of multiple integrated circuits placed thereon in a packaging process. Non-limiting examples of packages formed from a lead frame include plastic dual in-line integrated circuit packages (PDIP), small outline integrated circuits (SOICs), quad flat packages (QFPs), thin QFPs (TQFPs), Small Shrink Outline Plastic packages (SSOP), thin SSOPs (TSSOPs), thin very small-outline packages (TVSOPs), or other lead-containing packages. The device package 110 may include a metallic component to provide, e.g., RF shielding or a hermetic barrier to ambient moisture.

The device package 110 includes one or more leads 120. A component lead 120 may be any conventional or unconventional metallic conductor. A component lead 120 may connect to a printed circuit interconnect 130. The connection may include solder 135. The interconnect 130 may in turn be routed to a card edge connector 140, a connector pin 150, or a through-hole via 160. A connector socket (not shown) may connect to the card edge connector 140 or the connector pin 150. The electronic device 100 may include a heat sink 170 to aid in temperature control of one or more device packages. One or more discrete devices 180 having a metallic wire lead 185 may also be attached to the substrate 105. Any of the preceding metallic components, as well as other metallic conducting leads of similar scope, are contemplated for use with the embodiments described herein.

Figure 2:
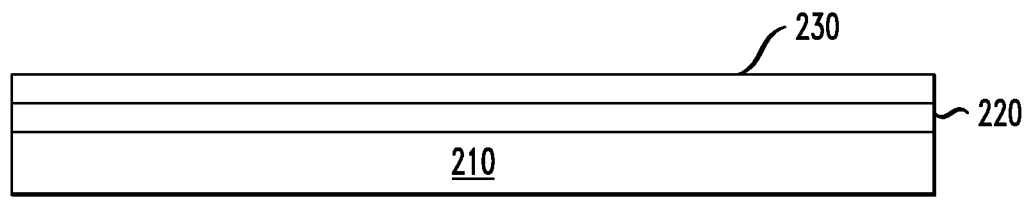
FIG. 2 illustrates a tin film on a substrate.

Turning to FIG. 2, illustrated is a metallic substrate 210. The metallic substrate 210 may be any of the metallic components previously described or of similar scope. An optional underplate layer 220 is placed between the metallic substrate 210 and a doped tin film 230. The doped tin film 230 may be a thin film, meaning the doped tin film 230 has a thickness less than about 50 µm, more preferably less than about 25 µm and even more preferably less than about 12 µm. A thin film is expected to behave differently from a thicker film due to, e.g., greater free energy of a surface region relative to a bulk region. This point is expanded upon below. The metallic substrate 210 may be any metallic material upon which a whisker-free tin finish layer is desired. In some cases, the substrate is an electronic component or a portion of a component. Examples include a circuit board interconnect (including a plated lead and a through-hole), a heat sink, a connector pin, a crimp contact, a device package or a package lead. In some embodiments, the metallic substrate 210 includes copper or a copper/beryllium alloy, but the invention is not so limited. The underplate layer 220 may be, e.g., a conventional nickel, silver, gold or other metallic layer. The underplate layer 220 may be desirable in some cases to reduce interdiffusion between the metallic substrate 210 and the doped tin film 230.

The doped tin film 230 may be conceptually separated into a bulk and a surface region. The bulk region is that portion of the doped tin film 230 in which tin atoms occupy a position that would be expected without perturbation. In other words, the tin atoms are positioned relative to each other in a manner consistent with the crystal structure and atomic spacing of the undisturbed lattice. The surface region is a region near the interface between the doped tin film 230 and the ambient in which atoms are disturbed from their expected lattice positions. Disorder may be result from, e.g., reduction of free energy of the surface. Generally, the surface region is limited to a few (2-3) monolayers below the surface/ambient interface. Because of the disturbed lattice, material properties in the surface region can vary markedly from those in the bulk.

When a tin layer is thin enough, the properties of the surface region may have an appreciable effect on the properties of the layer. Moreover, when the thickness of the tin layer is on the order of the grain size, or less, most grain boundaries in the layer are expected to intersect the surface of the layer. In some cases, access to the grain boundaries at the surface provides an advantageous path to introduce a dopant to the film. The thickness below which the tin layer is though to provide such benefit is though to be about 50 µm. While doping of a tin layer with thickness greater than this range may mitigate whisker growth, the embodiments described herein are expected to have particular benefit in films with thickness below this value. It is also thought that the percentage of grain boundaries in the tin film generally increases as the film thickness is reduced. In some embodiments, greater than about 70% of grain boundaries in the doped tin film 230 intersect the surface. However, when the tin film becomes too thin, the risk of voids and pinhole defects becomes too great. It is thought that this lower limit of tin film thickness is about 0.1 µm. A tin film with a thickness ranging between about 0.1 µm and about 50 µm is referred to herein as a "tin thin film."

Figure 3:
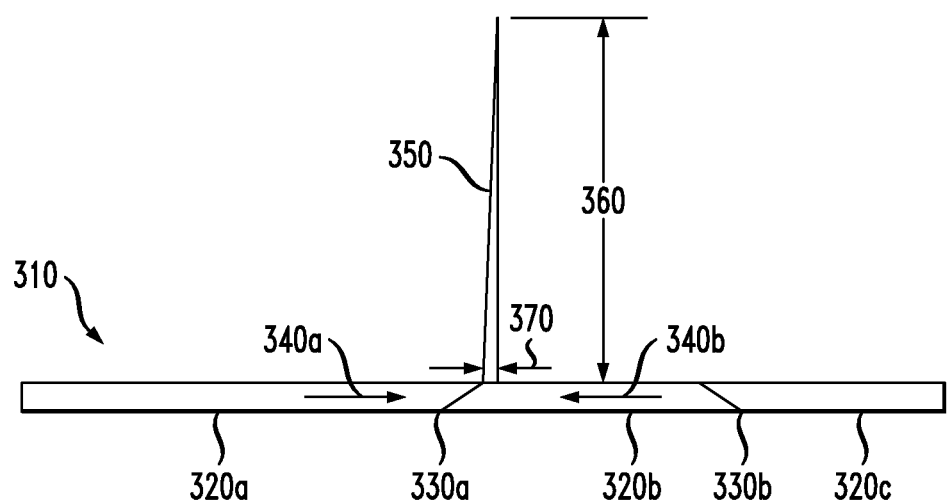
FIG. 3 illustrates a whisker on a tin film.

FIG. 3 illustrates a conventional lead-free tin film 310. The tin film 310 includes grains 320a, 320b, 320c, with grain boundaries 330a, 330b. The grains 320a, 320b are under compressive stress, as illustrated by stress vectors 340a, 340b. The compressive stress may be due to, e.g., post deposition stress or stress developed after relaxation as tin atoms diffuse by various pathways to reduce the overall free energy of the tin film 310. In some cases, the relaxation process results in creep that is manifested by the formation of a whisker 350 that may originate at a grain boundary, such as the grain boundary 330a. The term whisker as used herein refers to a growth formation on a tin film having a long axis length 360 of at least about 10 microns and a ratio of the long axis length 360 to a width 370 at the base of the formation of at least about 4:1.

It will be appreciated by those skilled in the pertinent art that a grain is a region of a solid material in which the atoms of the material exhibit the periodicity associated with the crystalline material. A particular grain will typically have an interior region which exhibits crystalline properties and has a particular crystal orientation. In general, grains of a film are arbitrarily oriented with respect to each other. The interface between grains is referred to as a grain boundary, and is characterized by relatively poor ordering of atoms with respect to the crystal lattice. The grain boundary is typically rich with vacancies, distorted bond lengths, and dangling bonds. Moreover, impurities are typically concentrated at grain boundaries by nucleation and growth of the grains. Diffusion of impurity atoms and atoms of the subject material is generally greater along grain boundaries than in the interior (bulk) of the grain. However, some impurities can interfere with diffusion along the grain boundary, "pinning" atoms that would otherwise diffuse.

Figure 4A:
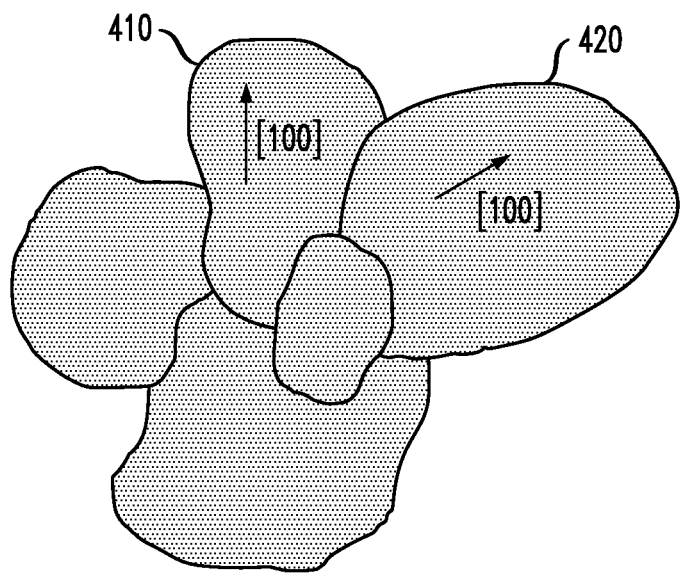
FIGS. 4A and 4B illustrate aspects of crystal grains and grain boundaries.
Figure 4B:
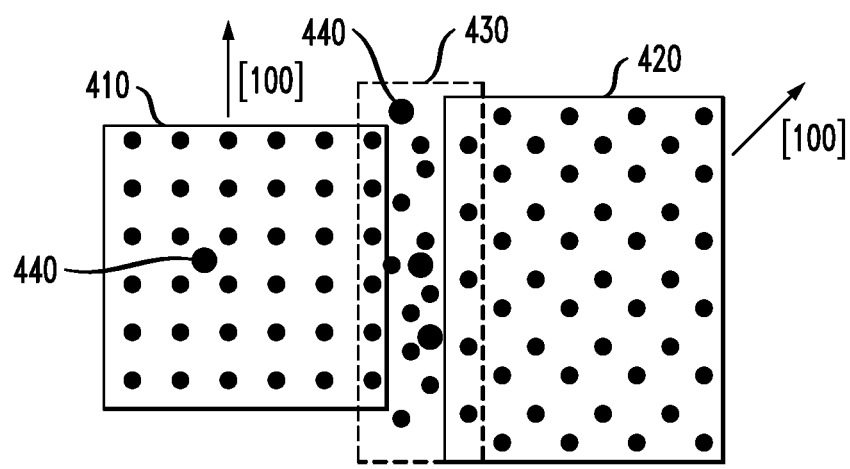

FIGS. 4A and 4B serve to illustrate the nature of the grain boundaries in greater detail. In FIG. 4A, a number of grains are illustrated as they might appear, e.g., looking down on the surface of the tin film 310. The grains are typically irregularly shaped and of varying size, as the process of nucleation and growth of the grains is inherently variable in nature. Two particular grains are highlighted for discussion purposes, without limitation by theory. A grain 410 has a [100] crystal orientation in a vertical direction, e.g., and a grain 420 has a [100] crystal orientation rotated 45° to that of the grain 410. In FIG. 4B, these grains are illustrated with a simplified illustration of an atomic lattice in each. Because the lattices are oriented differently, they don't generally align where the grains 410, 420 meet. The termination of the ordered lattice results in a relatively high free energy state of atoms in a grain boundary region 430. The atoms may shift from the lattice positions at which they would otherwise be expected to reduce the free energy of the local system. Thus, the atoms in the grain boundary region 430 are comparatively disordered relative to those in the grain lattices. The size of the grain boundary region may be several lattice constants in width, or about 1-2 nm. Moreover, some impurities in the tin film 310 may be excluded from the growing grain, causing the impurities to be concentrated in the grain boundary regions. Thus impurity atoms 440 have a higher concentration in the grain boundary region 430 than the average concentration of the impurity atoms in the tin film 310.

Returning to FIG. 3, over time, stress in the tin film 310 typically leads to creep. Creep as used herein refers to the solid state movement of material from a stress-induced high energy position to a lower energy position, such that the system tends to a lower energy state. In this context, the tin film 310 constitutes the system seeking a lower energy state. Various creep models are known to those skilled in the relevant art.

One well-characterized mechanism is power law creep. The power law creep model is associated with stress relaxation due to dislocation glide and/or climb. See, e.g., McCabe and Fine, Met Mater Trans, 33A, 1531, 2002. As such, it describes creep due to movement of tin atoms through the lattice of a crystal grain. The model may be described by $$\dot{\varepsilon} = \frac{A \cdot \mu}{R \cdot T} \left(\frac{b}{GS}\right)^p \exp\left(\frac{E_a}{R \cdot T}\right) \left(\frac{\sigma}{\mu}\right)^n \quad (1)$$

where
$\dot{\varepsilon}$ is the effective strain rate in $s^{-1}$,
A is an empirical materials coefficient,
$\mu$ is a temperature-dependent shear modulus,
R is the gas constant,
T is absolute temperature,
b is the Berger's vector,
GS is the average grain size,
p is a constant,
$E_a$ is the effective activation energy,
$\sigma$ is the applied stress, and
n is the stress exponent.

A model recently proposed by Boettinger, et al. is based on whisker growth rate models derived by Tu and Hutchinson in separate work. See, e.g., Acta Mater. 53, 5033, 2005. The Boettinger model is referred to herein as the BHT model in recognition of the contributions of Tu and Hutchinson. The BHT model is associated with stress relaxation via long-range grain boundary diffusion and whisker growth. The model is described by $$\dot{\varepsilon} = \frac{\Omega \cdot \delta \cdot D_{gb} \cdot \sigma}{R \cdot T \cdot GS \cdot c^2 \cdot \ln\left(\frac{c}{a}\right)} \quad (2)$$

where
$\Omega$ is the molar volume,
$\delta$ is the effective grain boundary width,
$D_{gb}$ is the grain boundary diffusion coefficient,
GS is the average grain size,
c is the long-range diffusion distance, and
a is the radius of the whisker.

Note that for the power law creep model, creep is proportional to $\sigma$ raised to the $n^{th}$ power, while for the BHT model, creep is linearly proportional to $\sigma$.

In general, atoms in a polycrystalline metallic film may diffuse by several mechanisms, including without limitation bulk (lattice) diffusion and grain boundary diffusion. The compressive stress in the doped tin film 230 provides a driving force for diffusion of tin atoms. Depending on the energy associated with each diffusion path, it may be energetically more favorable for tin atoms to diffuse through the lattice of the grains 320a, 320b, 320c, or to diffuse along the grain boundaries 330a, 330b.

In general, grain boundary diffusion is energetically more favorable than lattice diffusion at a threshold temperature below about 70% of the melting point. For tin, e.g., this threshold temperature is about 80 C. A pure tin film would be expected to behave in this manner. However, it is thought that an otherwise undoped tin film typically includes a small amount of oxygen unless measures are taken to exclude the oxygen. When oxygen is present as an impurity in the tin film, tin atoms at the grain boundaries may be effectively pinned by oxygen segregated at the grain boundaries 330a, 330b. In some cases, the dominant diffusion mechanism may differ depending on the stress in the tin film 310.

Figure 5:
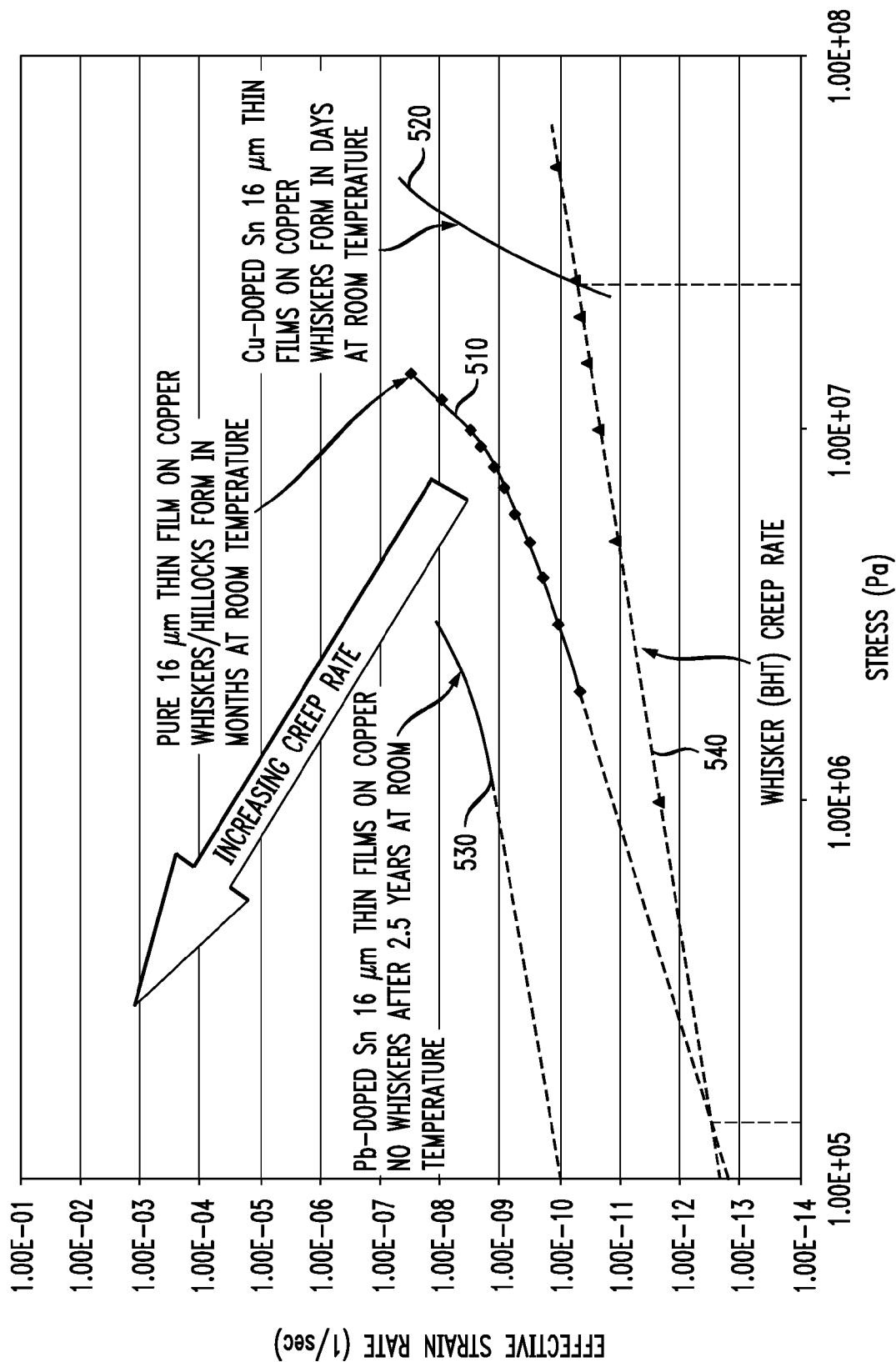
FIG. 5 illustrates creep characteristics of a pure tin film, a tin film doped with Cu, and a tin film doped with Pb.

This aspect is illustrated by FIG. 5, which includes experimental creep rates reported in the open literature for several 16 μm tin films on copper substrates and plotted on a log-log scale. See, e.g., Boettinger, supra. The effective strain rate of a film as a function of stress presented on a log-log plot is referred to herein as a creep characteristic. A creep characteristic 510 shows the creep rate for a pure film. A creep characteristic 520 shows the creep rate for a Cu-doped film. A creep characteristic 530 shows the creep rate for a Pb-doped tin film. A creep characteristic 540 shows the BHT (whisker) creep rate as derived from Eq. 2, the BHT model, using parameter values appropriate to a 16 μm tin film.

Several features of FIG. 5 are worthy of attention. First, each of the creep characteristics 510, 520, 530 exhibit power law behavior over at least a portion of each, as evidenced by a straight segment on the log-log scale of the coordinate axes. For example, the pure tin creep characteristic 510 exhibits power law creep, with n≈6.6 when the stress is greater than about 1E7 Pa, and n≈=2.2 when the stress is less than about 1E7 Pa. The Cu-doped tin creep characteristic 520 exhibits power law creep with n>7. The Pb-doped tin creep characteristic 530 exhibits power law creep with n≈2.2 at higher stress, and n≈2 at lower stress. The power-law behavior of the characteristics indicates that creep mechanisms with a greater effective creep rate, such as those responsible for Coble Creep, are pinned.

Second, the Cu-doped tin creep characteristic 520 intersects the BHT creep characteristic 540 at about 3E7 Pa. The extrapolated pure tin creep characteristic 510 intersects the BHT creep characteristic 540 at about 2E5 Pa. The extrapolated Pb-doped tin creep characteristic 530 is about parallel to the extrapolated BHT creep characteristic 540, so these characteristics either do not intersect or intersect at a very low stress value.

Third, the BHT creep characteristic 540 increases logarithmically (linearly on a log-log scale) with increasing stress. A higher creep rate on the BHT creep characteristic 540 is associated with a lower delay time (latency) before whiskers develop.

The whisker growth characteristics of the Cu-doped tin film are understood to be due to the cross-over from power law creep to BHT creep at a stress of about 3E7 Pa and an effective strain of rate about 6e-11 $s^{-1}$. When the Cu-doped tin creep characteristic 520 falls below the BHT characteristic 540, whiskers are expected to form. Because the strain rate at the intersection is relatively high, the whisker growth latency is expected to be relatively short. On the other hand, the BHT creep characteristic 540 intersects the extrapolated pure tin creep characteristic 510 at a strain rate about two orders of magnitude less than that of the Cu-doped tin creep characteristic 520. Again, whiskers are expected to form, but the latency is expected to be greater than for the case of pure tin. This expectation matches the observed latency of months in the case of the pure 16 μm tin film (creep characteristic 510), but only days for the Cu-doped 16 μm tin film (creep characteristic 520). The lack of observed whisker growth in the Pb-doped 16 μm tin film (creep characteristic 530) is understood to be due in part to dominance of power-law creep (e.g., ≈3 orders of magnitude greater creep rate) over the entire range of film stress over the observation period. Unpinning of other relaxation mechanisms thought to rely on grain boundary diffusion, e.g., Coble creep, is also thought to play a role in reducing whisker growth.

In view of the foregoing, it is presently recognized that the creep characteristics illustrated in FIG. 5 provide a framework for understanding the dynamics that drive whisker growth in tin films. General attributes of a lead-free dopant that suppress whisker formation may be determined in part from the relationship of the power law form of the creep characteristics 510, 520, 530 and their relationship to the BHT creep characteristic 540. For example, when the creep characteristic of a tin film, which may include a dopant, is less than the BHT creep rate at a given stress, the BHT creep mechanism is expected to dominate the creep behavior of the film. Thus, in such cases whiskers are expected to form in the film after a latency period related to the effective strain rate at which the two characteristics intersect. Conversely, when the creep characteristic of a tin film is greater than the BHT creep rate at a given stress, the power law creep mechanism is expected to dominate the creep behavior of the film. In such cases few or no whiskers are expected to form.

Thus, the general criteria of a lead-free whisker suppressing dopant are as follows: addition of the dopant 1) shifts the creep characteristic of a doped tin film to higher strain rate, 2) lowers the stress for a particular effective strain rate, and 3) reduces the value of the stress exponent n so that if the stress characteristic of the tin film does cross the BHT characteristic, it does so at a stress value unattainable during the desired observation period. An element that shifts the creep characteristics in a manner consistent with these criteria is included in the class of tin layer dopants. Such dopants are expected to result in a tin-containing layer that is substantially free of tin whiskers. Such a tin-containing layer is well suited to use as a pre-solder coating for, e.g., component leads and metallic portions of a device package. The tin-containing layer is also well suited as a finish coat on components that may not be soldered to, such as, e.g., heat sinks.

As used herein, substantially free of tin whiskers means the surface has fewer than about one whisker with a length greater than about 10 μm per 1 $cm^2$ on the surface of the tin layer for an average duration of 10 years under standard conditions (25° C., 1 atmosphere, less than about 60% RH, and about 20% $O_2$/80% $N_2$). The 10-year performance of a doped tin film may be estimated by acceleration models in an accelerating ambient. See, e.g., "Sn-Whiskers: Truths and Myths", J. W. Osenbach, J. M. DeLucca, B. D. Potteiger, A. Amin, and F. A. Baiocchi, J. Materials Science: Materials in Electronics, vol. 18, 2007, pp. 283-305, incorporated herein as if reproduced in its entirety. For purposes of the present discussion, the 10-year performance of the doped tin film under standard conditions is determined by the performance of the film for approximately 3200-4000 hours at 60 C, and 85% RH.

Without limitation by theory, the addition of a dopant to a tin film that forms some intermetallic compounds with the tin is expected to create precipitates that pin power-law diffusion mechanisms, shifting the power-law characteristic to higher stress and higher stress exponent. For example, tin is known to form chemical compounds with many metallic elements, including, e.g., copper, gold and iron. With respect to copper, tin and copper form several intermetallic compounds including, e.g., $Cu_6Sn_5$, $Cu_3Sn$ and $Cu_{31}Sn_8$, and the Cu-doped creep characteristic 520 of the Cu-doped 16 μm film is observed to lie at a higher stress value than the creep characteristics 510, 520, has a high value of the stress exponent n, and is associated with unacceptable whisker growth. Thus, an element such as copper is a poor candidate for a dopant. On the other hand, the inclusion at the grain boundaries of a metallic element that does not form a chemical compound with tin at temperatures below about 300 C, such as Al, is thought to unpin or create diffusion pathways that shift the creep characteristics of the film in the desired manner.

However, intermetallic compounds of tin and rare earth elements are relatively few and do not appear to pin the tin grain boundaries, but actually enhance creep rates. Thus, the rare earth elements are expected to behave similarly to Pb and Al, e.g., to segregate at grain boundaries of tin films and unpin grain boundary diffusion mechanisms associated with stress relaxation without whisker growth. Thus, dopants that are expected to result in the aforementioned characteristics include the rare earth elements. The rare earth elements include the lanthanoids (La, Ce, Pr, Nd, Pm, Sm, Eu, Gd, Tb, Dy, Ho, Er, Tm, Yb, Lu), Sc and Y. These elements are included in the class of tin layer dopants. Of the rare earth elements, Gd, Yb, Eu, Nd and Ce are preferred in some cases due to relative abundance and therefore lower cost.

Doping a thin tin film with Al is also expected to result in the aforementioned characteristics of a Pb-free dopant. In this case, Al is thought to act as a getter for trace amounts of oxygen in the tin lattice that would otherwise act to pin slip planes and dislocations, thus increasing the rate of lattice diffusion. The expected result is to shift the pure tin creep characteristic 510, having power-law creep characteristics, to higher strain rate and lower stress, again suppressing whisker growth. Thus, Al is included in the class of tin layer dopants.

The desired creep characteristics may be created by the addition of one or more of the aforementioned dopant elements. Such doping is contrary to current efforts to reduce whisker formation by increasing the purity of tin films. In some cases, the use of a single dopant is preferred to limit the number of intermetallic compounds that may form, both for greater predictability and uniformity of properties of the resulting pre-solder coating. Thus, the pre-solder coating may consist essentially of only tin and one of the aforementioned dopants, or may consist of only tin and two or more of the aforementioned dopants. As used herein, "consists essentially" means that elements other than tin and the dopant (or dopants), if present, are present in a concentration less than the cumulative concentration of all dopants. Such extraneous elements are referred to herein as "contaminants."

When the average concentration of a dopant or dopants in the doped tin film 230 is above a maximum value, the risk of forming precipitates of the dopant or an intermetallic compound is large enough to offset the benefit of the dopants. On the other hand, below a minimum value, the cumulative concentration of the dopant or dopants is insufficient to confer a benefit. The maximum and minimum values are thought to depend on the dopant used. In embodiments in which the dopant is a rare earth element, the beneficial range of average concentration is thought to be between about 0.1 wt. % and about 7 wt. %. A smaller range between about 1.5 wt. % and about 3.5 wt. % may be preferred in some embodiments to provide, e.g., doping process margin. In embodiments in which the doped tin film 230 is doped with Al, the beneficial dopant concentration is thought to range from about 0.1 wt. % to about 4 wt. %. Again, a smaller concentration may be preferred for process margin, e.g., ranging from about 1 wt. % to about 2 wt. %. With respect to contaminants, the preferred cumulative concentration of all contaminants is limited to less than about 10% of the cumulative concentration of all dopants. This limit is expected to ensure the properties of the doped tin film are dominated by the intentionally introduced dopant or dopants.

When the dopant concentration falls within the described ranges, the dopant element is thought to be uniformly distributed throughout the film, but having a concentration substantially higher at grain boundaries than in the bulk. In this context, substantially means at least 3 times greater. In such cases, the diffusion rate of tin along the grain boundary is expected to be at least about two times greater along the grain boundary than through the grains. Where the concentration of a dopant falls outside these ranges, whisker formation is thought to become more likely for the following reasons, presented without limitation by theory. When the concentration is below the lower range limit, the concentration of the dopant is thought to be insufficiently concentrated in a high enough fraction of the grain boundary regions. Thus there will be regions of the film in which the dopant is effectively absent, and the film is expected to behave as undoped tin, that is, be prone to whisker formation and growth. For cases in which the dopant concentration exceeds the higher concentration limit, the concentration is thought to be high enough to result in localized precipitation and growth of either the dopant element or an intermetallic of tin and the dopant. Once precipitation occurs, then it is thought to be energetically favorable for a number of large precipitates to form, depleting the region near the precipitate of the dopant. The depletion results in regions of the film where too little of the dopant exists. These regions will be susceptible to whisker growth, as described above. The precipitates are also expected to have a different modulus than the tin film, causing localized stress gradients as the film relaxes, further driving whisker growth.

In some embodiments, the doped tin film 230 may be formed by conventional methods such as, e.g., sputtering or electroplating, in which the dopant is present in the source (target or plating bath, e.g.). In other embodiments, the dopant may be applied in pure form to a pure tin film after deposition as a thin overlayer, again by sputtering or electroplating, e.g.

The method of processing a tin layer is expected to have a significant effect on the propensity for whisker growth. For example, methods including mechanical deformation such as, e.g., rolling, are expected to introduce a large number of defects such as dislocations and vacancies. These defects are expected to drive local diffusion kinetics in a manner that favors the formation of precipitates as described above, and resulting in increased whisker growth. This effect is expected to be especially pronounced in cold rolling, in which the temperature is below the grain boundary diffusion threshold, e.g., about 80 C for tin, for which short-term relaxation pathways are effectively quenched. Rolling methods are generally used for a layer having a thickness of millimeters or greater, herein referred as a sheet.

In contrast to rolling and other mechanical methods of forming a tin layer, the manufacturing methods described herein provide a tin film characterized by two relevant characteristics. First, the film has relatively few defects immediately after formation. Thus, e.g., the concentration of dislocations and vacancies is low. Second, the film has relatively uniform initial stress, e.g., few if any regions of localized stress to drive formation of dopant or intermetallic precipitates. These characteristics are thought to significantly contribute to the aforementioned advantageous distribution of dopant at the grain boundaries of the tin film.

Figure 6:
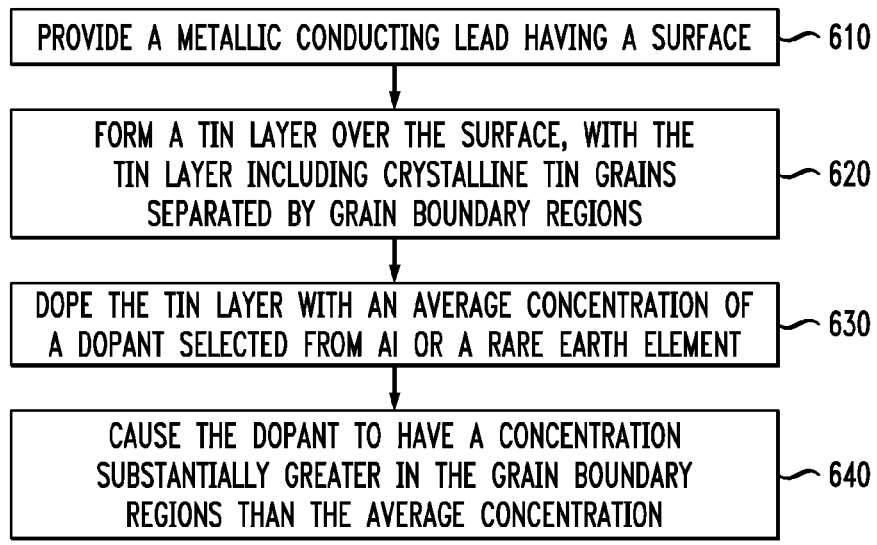
FIG. 6 illustrates a method of manufacturing an electronic device.

FIG. 6 presents a flow diagram illustrating selected steps in an example embodiment of a method 600 of manufacturing an electronic device. In a step 610, a metallic component having a surface is provided. The term "provided" includes, without limitation, manufacturing the metallic component in the local manufacturing environment in which subsequent steps in the method 600 are performed, and receiving the metallic component from a source external to the local manufacturing environment. The surface may optionally include a layer of a metal other than the metallic component, such as a layer of nickel, silver or gold.

In a step 620, a tin-containing layer is formed on the surface, with the tin-containing layer including crystalline tin grains separated by grain boundary regions. In some cases, greater than about 70% of the grain boundary regions intersect the interface between the tin-containing layer and the ambient. In a step 630, the tin layer is doped with an average concentration of one or more dopants selected from Al or a rare earth element. In some cases, the dopant is only one of Al or a rare earth element. In a step 640, the grain boundary regions are caused to be doped with a concentration of the dopant greater than the average concentration of dopant in the tin layer. It is noted that order of performing the steps 620-640 is not limited to the order in which the steps are presented in the example embodiment. For example, the step 630 may optionally be performed concurrently with the step 620, as when plating tin and the dopant simultaneously.

Figure 7A:
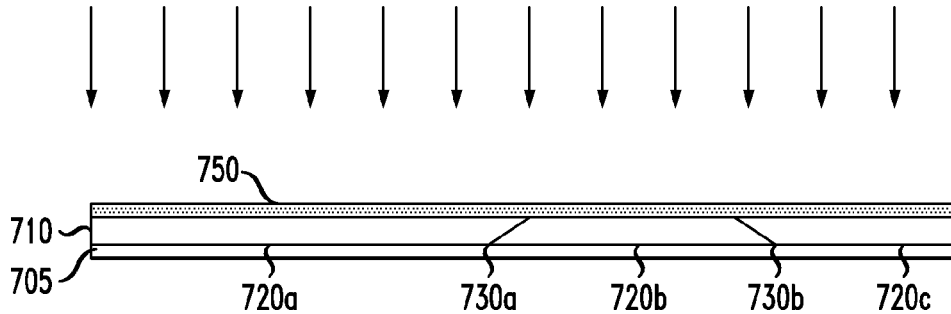
FIGS. 7A and 7B illustrate one example of the method of manufacturing an electronic device.
Figure 7B:
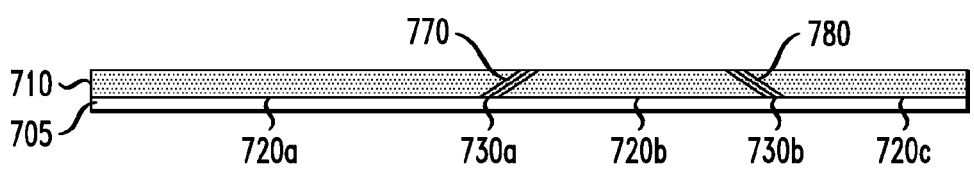

FIGS. 7A and 7B illustrate a non-limiting example embodiment of the method 600 in which the tin film is doped after formation. In FIG. 7A, a substrate 705 is provided. A pure tin film 710 is formed over the substrate 705 by, e.g., electroplating or sputtering. The tin film 710 includes grains 720a, 720b, 720c and grain boundary regions 730a, 730b therebetween that intersect the surface of the tin film 710. A source 740 of a dopant including Al or a rare earth element forms a dopant layer 750 over the tin film 710. The source 740 may again be, e.g., an electroplating or sputtering process, and need not be the same type of process used to provide the tin film.

In FIG. 7B, a heat source 760, such as radiant heat, heated platform, or an oven, e.g., provides activation energy to cause the dopant layer 750 to diffuse into the tin film 710, resulting in an average concentration of dopant in the tin film 710. The dopant layer 750 preferentially diffuses into the grain boundary regions 730a, 730b, resulting in a higher concentration of the dopant in the grain boundary regions 730a, 730b than the average concentration of the dopant in the tin film 710. In some embodiments, the concentration of the dopant in the grain boundary regions 730a, 730b is at least about 10% greater than the concentration of average dopant concentration in the tin film 710. In some cases, differential diffusion rates of the dopant into the grains 720a, 720b, 720c and the grain boundary regions 730a, 730b may result in a concentration at least about 50% greater in the grain boundary regions 730a, 730b than the average concentration. For dopants with a particularly large difference of diffusion rates, the concentration of the dopant in the grain boundary regions 730a, 730b may be at least about 90% greater than the average concentration. Without limitation, this method is expected to provide some benefit over deposition from a doped source, as the number density of defects that may act to pin lattice creep mechanisms is expected to be reduced relative to a method using a doped source. Moreover, intermetallic precipitates that could otherwise cause local stress and dopant depletion in the tin film 710 are expected to be substantially reduced or eliminated from the tin film 710.

Although the present invention has been described in detail, those skilled in the art should understand that they can make various changes, substitutions and alterations herein without departing from the spirit and scope of the invention in its broadest form.

What is claimed is:

1. An electronic device, comprising:
   a metallic conducting lead having a surface; and
   a pre-solder coating over said surface consisting essentially of tin and one or more lanthanide rare earth elements capable of forming an intermetallic compound with said tin having grain boundary regions therein and resulting in a higher concentration of said one or more lanthanide rare earth elements in said grain boundary regions than an average concentration of said one or more lanthanide rare earth elements in said pre-solder coating.

2. The electronic device as recited in claim 1, wherein said pre-solder coating consists essentially of said tin and only one of said lanthanide rare earth elements.

3. The electronic device as recited in claim 1, wherein the conducting lead is a portion of a lead frame.

4. The electronic device as recited in claim 1, wherein said one or more lanthanide rare earth elements is selected from the group consisting of Gd, Yb, Eu, Nd and Ce.

5. The electronic device as recited in claim 1, wherein said one or more lanthanide rare earth elements has a total concentration in said pre-solder coating within a range from about 0.1 wt. % to about 7 wt. %.

6. The electronic device as recited in claim 5, wherein said total concentration is within a range from about 1.5 wt. % to about 3.5 wt. %.

7. The electronic device as recited in claim 1, wherein a thickness of said pre-solder coating is within a range from about 0.1 µm to about 50 µm.

8. The electronic device as recited in claim 1, wherein said conducting lead is selected from the group consisting of:
   a printed circuit interconnect;
   a connector;
   a device package lead; and
   a wire.

9. The electronic device as recited in claim 1, further comprising a device package, or a heat sink, that includes said pre-solder coating.

10. The electronic device as recited in claim 1, wherein said one or more lanthanide rare earth elements is selected from the group consisting of La, Pr, Pm, Sm, Eu, Gd, Tb, Dy, Ho, Er, Tm, Yb, and Lu.

11. A method of forming a pre-solder coating over an electrical lead, comprising:
   providing a metallic conducting lead having a surface;
   forming a tin layer over said surface, said tin layer including grains separated by grain boundary regions; and
   doping said tin layer with an average concentration of one or more lanthanide rare earth elements such that said pre-solder coating consists essentially of said tin and said one or more lanthanide rare earth elements capable of forming an intermetallic compound with said tin, wherein said one or more lanthanide rare earth elements has a concentration substantially greater in said grain boundary regions than said average concentration.

12. The method as recited in claim 11, wherein said one or more lanthanide rare earth elements is selected from the group consisting of Gd, Yb, Eu, Nd and Ce.

13. The method as recited in claim 11, wherein said one or more lanthanide rare earth elements has a concentration within said pre-solder coating within a range from about 0.1 wt. % to about 7 wt. %.

14. The method as recited in claim 11, wherein said one or more lanthanide rare earth elements has a concentration in said pre-solder coating within a range from about 1.5 wt. % to about 3.5 wt. %.

15. The method as recited in claim 11, wherein a thickness of said pre-solder coating is within a range from about 0.1 µm to about 50 µm.

16. The method as recited in claim 11, wherein said metallic conducting lead is portion of a lead frame.

17. The method as recited in claim 11, wherein said one or more rare earth elements diffuses into said tin layer via said grain boundaries.

18. The method as recited in claim 11, wherein said one or more lanthanide rare earth elements is selected from the group consisting of La, Pr, Pm, Sm, Eu, Gd, Tb, Dy, Ho, Er, Tm, Yb, and Lu.

19. An electronic device, comprising:
   a metallic conducting lead having a surface; and
   a pre-solder coating over said surface consisting essentially of tin, aluminum and one or more lanthanide rare earth elements capable of forming an intermetallic compound with said tin having grain boundary regions therein and resulting in a higher concentration of said aluminum and said one or more lanthanide rare earth elements in said grain boundary regions than an average concentration of said aluminum and said one or more lanthanide rare earth elements in said pre-solder coating.

20. The electronic device as recited in claim 19, wherein a concentration of said Al in said pre-solder coating is within a range from about 0.1 wt. % to about 4 wt. %.

21. The electronic device as recited in claim 19, wherein a concentration of said Al in said pre-solder coating is within a range from about 1 wt. % to about 2 wt. %.

22. The electronic device as recited in claim 19, wherein said one or more lanthanide rare earth elements has a total concentration in said pre-solder coating within a range from about 0.1 wt. % to about 7 wt. %.

23. The electronic device as recited in claim 22, wherein said total concentration is within a range from about 1.5 wt. % to about 3.5 wt. %.

24. The electronic device as recited in claim 19, wherein a thickness of said pre-solder coating is within a range from about 0.1 µM to about 50 µm.

25. The electronic device as recited in claim 19, wherein said conducting lead is selected from the group consisting of:
   a printed circuit interconnect;
   a connector;
   a device package lead; and
   a wire.

26. The electronic device as recited in claim 19, further comprising a device package, or a heat sink, that includes said pre-solder coating.

27. The electronic device as recited in claim 19, wherein said one or more lanthanide rare earth elements is selected from the group consisting of La, Pr, Pm, Sm, Eu, Gd, Tb, Dy, Ho, Er, Tm, Yb, and Lu.

\* \* \* \* \*